(12) United States Patent
Berchtold et al.

(10) Patent No.: US 7,473,845 B2
(45) Date of Patent: Jan. 6, 2009

(54) STRUCTURAL UNIT AND METHOD FOR THE PRODUCTION OF A STRUCTURAL UNIT

(75) Inventors: Lorenz Berchtold, Nuremberg (DE); Karlheinz Glaser, Flein (DE); Dietmar Kurzeja, Malsch (DE)

(73) Assignee: Tyco Electronics Pretema GmbH & Co. KG, Niefern-Oeschelbronn (DE)

( * ) Notice: Subject to any disclaimer, the term of this patent is extended or adjusted under 35 U.S.C. 154(b) by 267 days.

(21) Appl. No.: 10/550,032

(22) PCT Filed: Mar. 19, 2004

(86) PCT No.: PCT/EP2004/002864

§ 371 (c)(1),
(2), (4) Date: Jul. 24, 2006

(87) PCT Pub. No.: WO2004/084598

PCT Pub. Date: Sep. 30, 2004

(65) Prior Publication Data

US 2006/0261452 A1    Nov. 23, 2006

(30) Foreign Application Priority Data

Mar. 21, 2003    (DE) ............................ 103 13 832

(51) Int. Cl.
*H02G 3/08*    (2006.01)

(52) U.S. Cl. .................. 174/50; 174/58; 174/64; 174/528; 174/521; 361/714

(58) Field of Classification Search ............ 174/50, 174/58, 64, 521, 528, 536, 66, 67; 361/714, 361/816, 818, 800; 220/3.2, 3.6, 4.02, 241, 220/242

See application file for complete search history.

(56) References Cited

U.S. PATENT DOCUMENTS

| | | | |
|---|---|---|---|
| 3,422,320 A * | 1/1969 | Woodling | 257/710 |
| 4,629,824 A | 12/1986 | Giler, Jr. et al. | |
| 5,689,089 A | 11/1997 | Polak et al. | |
| 6,870,097 B2 * | 3/2005 | Oda | 174/50 |
| 6,946,602 B1 * | 9/2005 | Gibbs et al. | 174/560 |
| 7,186,912 B2 * | 3/2007 | Guan et al. | 174/50 |
| 7,321,096 B1 * | 1/2008 | Huang | 174/58 |
| 7,379,291 B2 * | 5/2008 | Quazi | 351/674 |
| 2002/0112870 A1 | 8/2002 | Kobayashi et al. | |

FOREIGN PATENT DOCUMENTS

| | | |
|---|---|---|
| DE | 10313832 A1 | 10/2004 |
| EP | 0309920 A2 | 4/1989 |
| FR | 2655809 | 6/1991 |

* cited by examiner

*Primary Examiner*—Dhiru R Patel
(74) *Attorney, Agent, or Firm*—Barley Snyder LLC

(57) ABSTRACT

A structural unit having a frame, a connecting face that surrounds an opening and a cover that is attached to the connecting face to cover the opening. The frame and the cover are formed of materials with different coefficients of thermal expansion, and the connecting face has a channel that opens towards the cover. At least one duct communicates with the channel so that when a filling compound is injected into the duct it is received in the channel. The filling compound thereby attaches the cover to the frame and provides a seal therebetween.

17 Claims, 3 Drawing Sheets

Figure 3A:
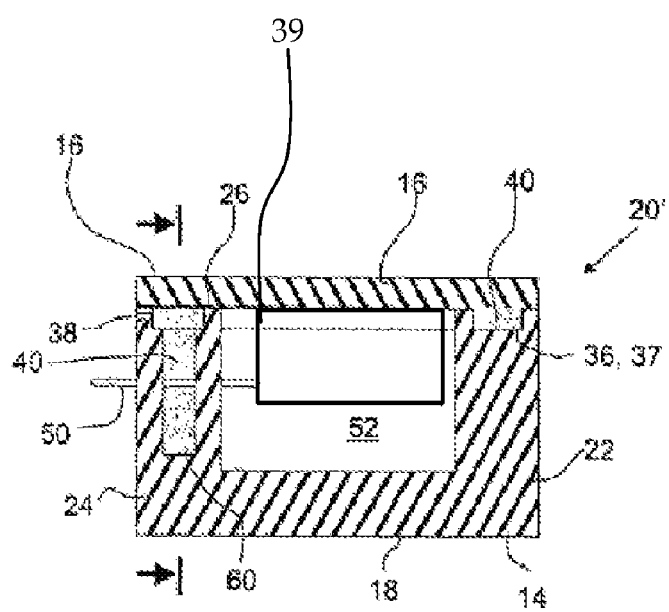

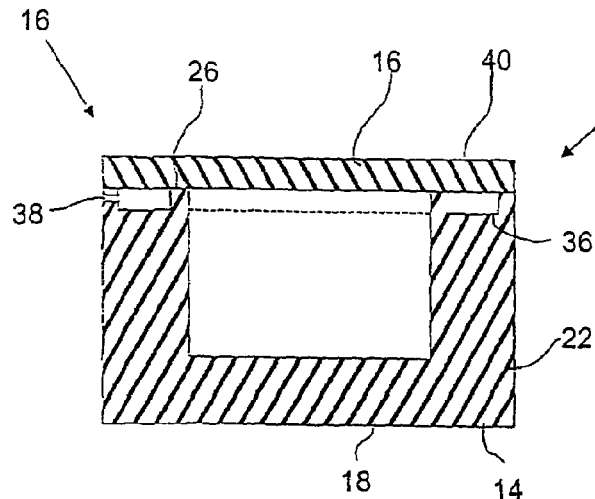
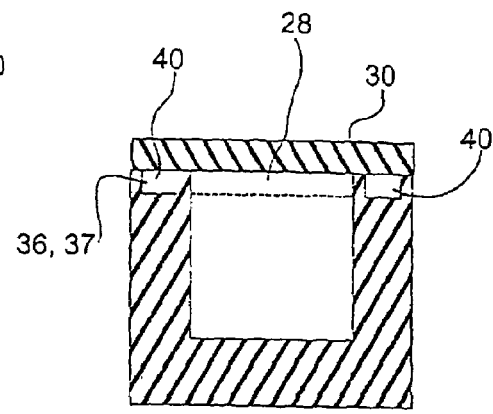
Fig.1A  Fig. 1B
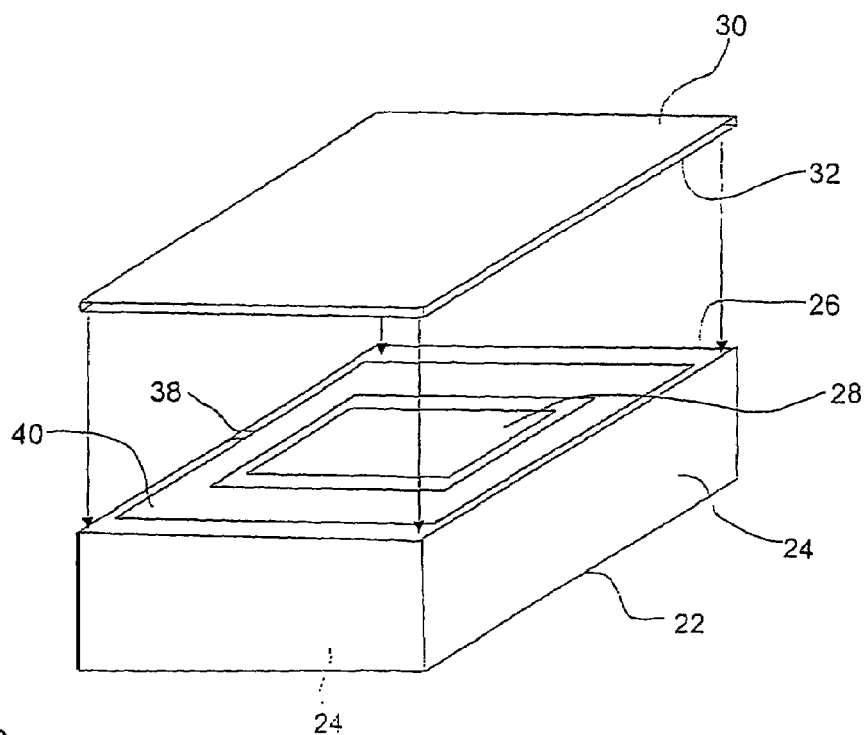
Fig. 2

STRUCTURAL UNIT AND METHOD FOR THE PRODUCTION OF A STRUCTURAL UNIT

This application is a National Stage Application filed under 35 U.S.C. § 371 of PCT/EP 2004/002864, filed on Mar. 19, 2004, which claims priority of German Application No. DE 103 13832.3, filed Mar. 21, 2003.

FIELD OF THE INVENTION

The invention relates to a structural unit, such as a housing, having a frame and a cover with different coefficients of thermal expansion wherein the frame and the cover are simultaneously connected and sealed with an adhesive. The invention further relates to a method for producing the same.

BACKGROUND

In many sectors of technology, particularly in the automobile sector, housings are hermetically sealed to protect components housed therein. In the automobile sector there is especially a need for housings that remain sealed to water and oil even when the housings are exposed to adverse conditions, such as large variations in temperature. It is also necessary to dissipate heat from inside the housing, if any of the components accommodated in the housing are heat-generating components, such as electronic circuits. To remove heat from inside the housing, one face of the housing is generally constructed as a metal plate. The metal plate is thermally coupled to the heat-generating components and acts as a heat sink. The remainder of the housing is generally made of a plastic material, because forming the entire housing out of metal is expensive and complicated. Because plastic and metal have different coefficients of thermal expansion, however, the seal between the plastic and the metal deteriorates when the housing is exposed to large variations in temperature.

To account for the deterioration of the seal between the metal plate and the plastic portion of the housing, it is known to provide strips of an elastic material, such as silicone, between the plastic portion of the housing and the metal plate. The elastic material is positioned between the plastic portion of the housing and the metal plate, and then the metal plate is fastened to the plastic portion of the housing by a screw or other clamping means, which presses the metal plate into the elastic material. Positive-locking means, such as groove and tongue connections, are also used to improve the quality of the seal between the plastic portion of the housing and the metal plate. This kind of fastening and sealing, however, is complicated, requires additional production steps, and is expensive.

SUMMARY

It is therefore an object of the invention to develop a structural unit, particularly a housing, with the aforementioned properties that can be more cost efficiently produced.

This and other objects are achieved by a structural unit having a frame with a connecting face that surrounds an opening and a cover that is attached to the connecting face to cover the opening. The frame and the cover are formed of materials with different coefficients of thermal expansion, and the connecting face has a channel that opens towards the cover. At least one duct communicates with the channel so that when a filling compound is injected into the duct it is received in the channel. The filling compound thereby attaches the cover to the frame and provides a seal therebetween.

BRIEF DESCRIPTION OF THE DRAWINGS

The invention will be explained in greater detail below with reference to the accompanying drawings, wherein:

FIG. 1 A is a sectional view from a front side of a first embodiment of a structural unit according to the invention;

FIG. 1B is a sectional view from a side of the structural unit of FIG. 1A;

FIG. 2 is a perspective view of the structural unit of FIG. 1A;

FIG. 3A is a sectional view from a front side of a second embodiment of the structural unit;

FIG. 3B is a sectional view from a side of the structural unit of FIG. 3A;

FIG. 4A is a perspective view of a third embodiment of the structural unit; and FIG. 4B is a sectional view of the structural unit of FIG. 4A showing the assembly of the structural unit.

DETAILED DESCRIPTION OF THE EMBODIMENTS

FIGS. 1A and 1B show a first embodiment of a structural unit 10. The structural unit 10 includes a frame 14 and a cover 16. The term "frame" as used herein is to be understood as a structure that has a face that defines an opening and a portion that may be connected with a housing member so that a closed housing is produced. Alternatively, the portion can itself form the housing member. The term "cover" as used herein is to be understood as a structure that may cover the opening defined by the face.

As shown in FIG. 1, the structural unit 10 illustrated herein is formed as a housing 20, which can accommodate electronic components, such as a transmission control apparatus. The frame 14 of the housing 20 is formed as an essentially rectangular housing member 22. The housing member 22 is made from a plastic material by injection molding to have a base 18 and side walls 24, as shown in FIG. 2. The side walls 24 and the base 18 form an opening 28 that extends from a connecting face 26 of the housing member 22 into an interior of the housing member 22. The housing member 22 could also be, for example, constructed as a component of the frame 14. Additionally, the housing member 22 could be any desired shape, and the opening 28 could be any desired dimension. Heat-generating components (not shown) may be accommodated in the opening 28 of the housing member 22.

As shown in FIGS. 1 and 2, the cover 16 is formed as a lid 30. The lid 30 has a flat bottom surface 32. The bottom surface 32 is formed to extend essentially parallel to the connecting face 26 and may have a dimension such that it covers the opening 28 when the lid 30 is attached to the housing member 22 at the connecting face 26. The lid 30 is made from a metal material. The heat-generating components (not shown) that are accommodated in the housing member 22 may be thermally coupled to the lid 30. The lid 30 thereby conveys heat from the interior of the housing 20 to the exterior of the housing 20 by acting as a heat sink.

As shown in FIG. 1, recesses 36 are formed in the connecting face 26. The recesses 36 form a channel 37 that surrounds the opening 28 in the frame 14. The depth of the channel 37 is such that a filling compound 40, to be described later, has sufficient resilience to be able to absorb, for example, shear forces arising between the lid 30 and the housing member 22 due to thermal expansion. At least one duct 38 extends from an outside surface of the housing member 22 inward toward the channel 37 to communicate with the channel 37. In addition or alternatively, the duct 38 could extend from an inside surface of the housing member 22 outward toward the channel 37 to communicate with the channel 37.

As shown in FIG. 2, a filling compound 40 is supplied in the channel 37 formed between the lid 30 and the housing member 22. The filling compound 40 illustrated herein is a hot-melt adhesive, however, other materials which may be applied at room temperature and which have similar properties may also be used. The filling compound 40 is resilient and has optimal sealing characteristics so that the filling compound 40 is capable of sealing the housing 20 and absorbing stress from the shear forces occurring during thermal expansion of the housing member 22 and the lid 30. The filling compound 40, depending on the application, should be oil-resistant and capable of withstanding temperatures as low as minus 40 degrees Celsius. Adhesive properties of the filling compound 40 are subordinate to the sealing quality and elasticity of the filling compound 40. The filling compound 40 may be a one-component material or a two-component material. The two-component material enables the temperature of use to be above the processing temperature of the filling compound 40. Additionally, reactively cross-linking two-component filling compounds 40, polyamide based filling compound 40, or polyurethane based filling compounds 40 can be used. The polyamide based filling compounds are particularly favorable with regard to the desired properties of oil resistance, flexibility even at low minus temperatures, process ability, and resilience.

The lid 30 is attached to the housing member 22 by using an injection molding process. The housing member 22 and the lid 30 are brought together in an injection molding machine (not shown). To facilitate handling, the housing member 22 and the lid 30 may be tacked together to form a single unit before inserting the housing member 22 and the lid 30 in the injection molding machine (not shown). The filling compound 40 is then heated and injected into the channel 37 via the duct 38. The filling compound 40 is injected until it fills the entire channel 37 and comes into contact with the bottom surface 32 of the lid 30. Once the filling compound 40 is cooled, the filling compound 40 firmly attaches the housing member 22 to the lid 30 and seals the opening 28 hermetically such that water, oil, or other materials can not reach the inside of the housing 20 between the lid 30 and the housing member 22.

Figure 3B:
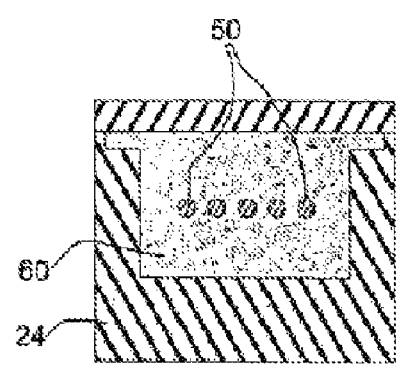

FIG. 3 shows a second embodiment of the structural unit 10 formed as a housing 20'. Because the housing 20' differs only slightly from the housing 20 of FIG. 1, parts of the housing 20' identical to parts of the housing 20 will be identified with identical reference numerals and further description of those parts will be omitted.

The housing 20' may be used when a lead-through, such as a contact 50, is required. For example, a contact 50 may be required when an electrical control unit 39 arranged inside the housing 20' has to be supplied with power and signals. As shown in FIG. 3A, the contact 50 passes completely through the side wall 24 of the housing member 22 from outside the housing 20' to an inside 52 of the housing 20'. There are various ways that the contact 50 may be passed through the side wall 24. For example, the contact may be shot through the side wall 24 or encapsulated by injection molding during production of the housing member 22.

To achieve a seal around the contact 50, a cavity 60 is formed in the housing member 22 that extends from the channel 37 toward the base 18 of the housing member 22. The cavity 60 is formed such that it extends beyond a point where the contact 50 penetrates the side wall 24. The cavity 60 surrounds the contact 50 and extends far enough horizontally for all of the contacts 50 in the housing 20' to be located in an area of the cavity 60. Alternatively, the cavity 60 could extend through the base 18 to the outside of the housing 20'. This solution is needed, for example, when the contact 50 is encapsulated by injection molding during production of the housing member 22.

When the filling compound 40 is injected into the channel 37, the cavity 60 also receives the filling compound 40. If the cavity 60 extends through the base 18 to the outside of the housing 20', the portion of the cavity 60 that opens to the outside of the housing 20' needs to be covered during injection of the filling compound 40. The filling compound 40 covers the portion of the contact 50 located in the cavity 60 and seals any gaps between the contact 50 and the side wall 24. As a result, any gaps in the side wall 24 are sealed simultaneously with the attachment of the lid 30 to the housing member 22.

Figure 4A:
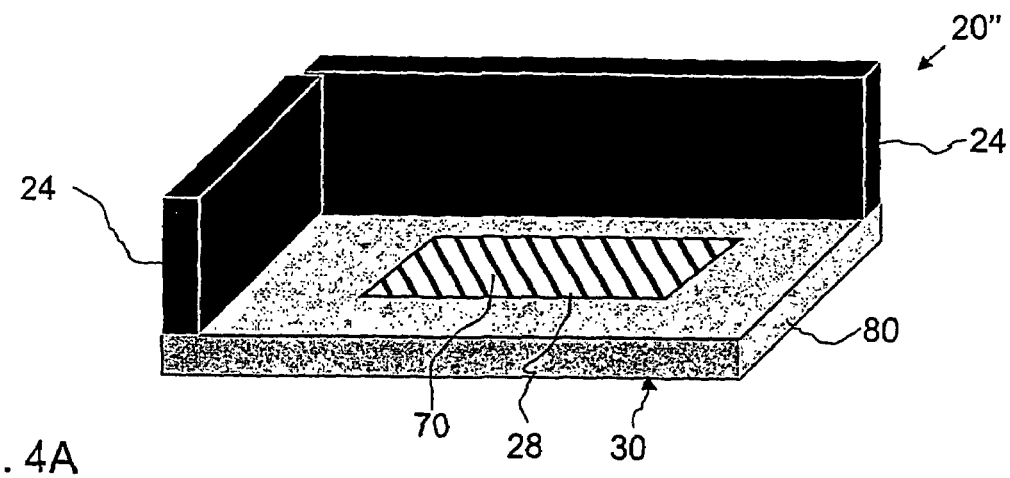

FIG. 4 shows a third embodiment of the structural unit 10 formed as a housing 20''. Because the housing 20'' differs only slightly from the housing 20 of FIG. 1, parts of the housing 20'' identical to parts of the housing 20 will be identified with identical reference numerals and further description of those parts will be omitted.

Figure 4B:
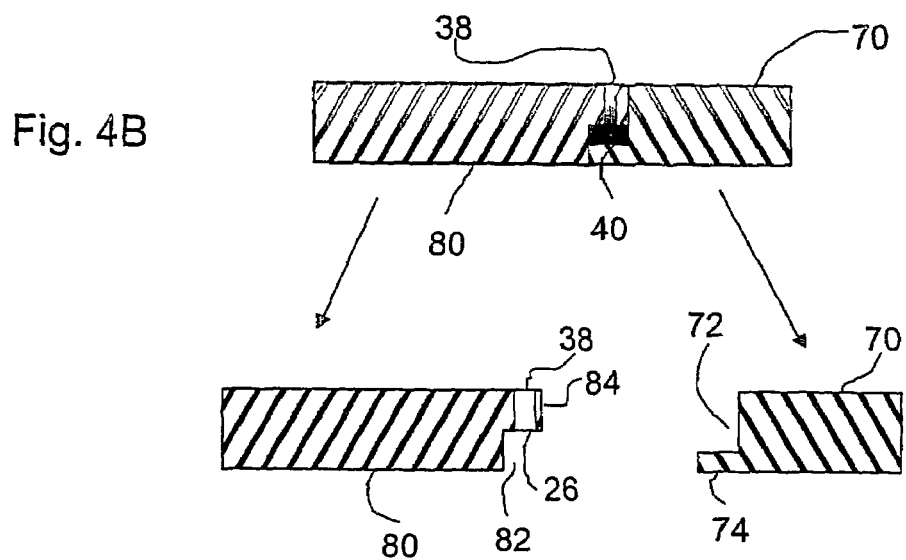

As shown in FIG. 4B, the opening 28 is partially covered by a top portion 80. The top portion 80 is made from the same material as the side walls 24 and may be integrally formed therewith. The top portion 80 has an opening 28. A cut-out 82 is formed in an edge of the top portion 80 surrounding the opening 28 to form a step part 84. The duct 38 extends from an inner surface of the step part 84 to the connecting face 26.

The lid 30 has a covering portion 70 formed to cover the opening 28. The lid 30 is made from a conductive material, for example, metal and preferably aluminium. The lid 30 is formed such that it is flush with an outer surface of the top portion 80 when received on the connecting face 26. In order to achieve a structure that is flush with the outer surface of the top portion 80, the covering portion 70 of the lid 30 has a cut-out 72 that forms a flange 74. The size of the cut-out 82 of the top portion 80 and the cut-out 72 of covering portion 70 are such that the sum of the depths of the cut-outs 82, 72 is greater than a thickness of the top portion 80 or the lid 30 to ensure that the top portion 80 and the lid 70 form a flat surface without any gaps therebetween when mated, as shown in FIG. 4B.

The top portion 80 is attached to the lid 30 in a similar manner as the lid 30 is attached to the housing member 22 in the first embodiment. Specifically, the top portion 80 is attached to the lid 30 by injecting the filling compound 40 in the duct 38 so that the filling compound 40 is received in the cut-out 82 of the top portion 80 to fill the gap formed between the connecting face 26 and the flange 74 of the lid 30.

Unlike the previous solutions, which provided separate elements for fastening and for sealing, the two functions may be achieved solely by means of the filling compound. It is therefore clear that a very simple way has been provided of connecting together two parts with different coefficients of thermal expansion, wherein at the same time the space between the two parts is sealed. Because the properties of the filling compound 40 are optimised when an appropriate volume of the filling compound 40 is provided, the connection between the two parts withstands adverse conditions, such as large temperature variations, and is sealed from fluids. Because the filling compound 40 is located in the channel 37, surface areas open to external attack are very small, making resistance to adverse environmental influences very high. Use of the structural unit 10 according to the invention in the motor vehicle sector and in the electronics sector therefore results in considerable advantages.

Additionally, the method according to the invention for connecting two parts with different coefficients of thermal expansion may be performed particularly simply and economically. Introduction of the filling compound 40, preferably a hot-melt adhesive, may be achieved with conventional injection molding processes, wherein the frame 14 and the cover 16 in this case form the mold in the injection molding machine. In addition, it is no longer necessary to use extra fastening elements, such as screws etc.

The foregoing illustrates some of the possibilities for practicing the invention. Many other embodiments are possible within the scope and spirit of the invention. It is, therefore, intended that the foregoing description be regarded as illustrative rather than limiting, and that the scope of the invention is given by the appended claims together with their full range of equivalents.

The invention claimed is:

1. A structural unit comprising:
   a frame having a connecting face that surrounds an opening;
   a cover that is attached to the connecting face to cover the opening, the frame and the cover being formed of materials with different coefficients of thermal expansion;
   a channel on the connecting face that opens towards the cover; and at least one duct in communication with the channel such that a filling compound injected into the duct is received in the channel, the filling compound attaching the cover to the frame and providing a seal therebetween.

2. The structural unit according to claim 1, wherein the filling compound is a two-component adhesive.

3. The structural unit according to claim 1, wherein the filling compound is a reactively cross-linking adhesive.

4. The structural unit according to claim 1, wherein the filling compound is a polyurethane based material.

5. The structural unit according to claim 1, wherein the filling compound is a polyamide based adhesive.

6. The structural unit according to claim 1, wherein the filling compound is a hot-melt adhesive.

7. The structural unit according to claim 1, wherein the frame is made of a plastic material and the cover is made of metal.

8. The structural unit according to claim 1, wherein the structural unit is a housing.

9. The structural unit according to claim 8, wherein the housing has at least one electronic component thermally coupled to the cover.

10. The structural unit according to claim 9, wherein a contact passes through the frame and at least one cavity is provided in the frame that communicates with the channel and the contact so that the filling compound is received in the channel and surrounds the contact.

11. A method for the production of a structural unit comprising the steps of:
    providing a frame having a connecting face that surrounds an opening, the connecting face having a channel,
    providing a cover that attaches to the connecting face so that it covers the opening, the frame and the cover being made from materials with different coefficients of thermal expansion,
    positioning the cover adjacent to the frame such that the cover lies on the connecting face, and
    injecting a filling compound through at least one injection duct into the channel to connect the cover to the frame and seal a gap therebetween.

12. The method according to claim 11, wherein the filling compound is a two-component adhesive.

13. The method according to claim 11, wherein the filling compound is a reactively cross-linking adhesive.

14. The method according to claim 11, wherein the filling compound is a polyamide based adhesive.

15. The method according to claim 11, wherein the filling compound is a polyurethane based material.

16. The method according to claim 11, wherein the filling compound is a hot-melt adhesive.

17. The method according to claim 11, wherein,
    the frame is provided with a cavity, and at least one contact element is introduced into the frame such that it penetrates the frame and is received in the cavity, wherein the contact element is encapsulated by injection molding when the filling compound is injected into the cavity and a seal is produced between the contact element and the frame.

* * * * *